(12) United States Patent
Sashida

(10) Patent No.: US 7,745,232 B2
(45) Date of Patent: Jun. 29, 2010

(54) SEMICONDUCTOR DEVICE AND METHOD OF MANUFACTURING THE SAME

(75) Inventor: Naoya Sashida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/285,748

(22) Filed: Oct. 14, 2008

(65) Prior Publication Data

US 2009/0068764 A1 Mar. 12, 2009

Related U.S. Application Data

(62) Division of application No. 10/096,864, filed on Mar. 14, 2002, now Pat. No. 7,456,454.

(30) Foreign Application Priority Data

Nov. 15, 2001 (JP) ............................. 2001-350323

(51) Int. Cl.
H01L 21/8239 (2006.01)
(52) U.S. Cl. .................... 438/3; 438/253; 257/E21.664
(58) Field of Classification Search .................. 438/3, 438/239, 253, 396; 257/295, 296, 306, 532, 257/E21.663, E21.664, E21.009
See application file for complete search history.

(56) References Cited

U.S. PATENT DOCUMENTS

| | | | | |
|---|---|---|---|---|
| 4,884,123 A | * | 11/1989 | Dixit et al. | 257/751 |
| 5,340,370 A | * | 8/1994 | Cadien et al. | 51/308 |
| 5,354,712 A | * | 10/1994 | Ho et al. | 438/643 |
| 5,399,890 A | | 3/1995 | Okada et al. | |
| 5,475,248 A | * | 12/1995 | Takenaka | 257/295 |
| 5,624,864 A | | 4/1997 | Arita et al. | |
| 5,716,875 A | | 2/1998 | Jones, Jr. et al. | |
| 5,722,875 A | * | 3/1998 | Iwashita et al. | 451/8 |
| 5,858,851 A | * | 1/1999 | Yamagata et al. | 438/396 |
| 5,864,153 A | | 1/1999 | Nagel et al. | |
| 5,933,758 A | * | 8/1999 | Jain | 438/687 |
| 6,004,188 A | * | 12/1999 | Roy | 451/41 |
| 6,010,962 A | * | 1/2000 | Liu et al. | 438/687 |

(Continued)

FOREIGN PATENT DOCUMENTS

DE 100 01 118 A1 7/2001

(Continued)

OTHER PUBLICATIONS

Communication for European Patent Office for Application No. 02 25 1817 dated Mar. 23, 2005 enclosing European Search Report.

(Continued)

*Primary Examiner*—Mary Wilczewski
(74) *Attorney, Agent, or Firm*—Westerman, Hattori, Daniels & Adrian, LLP

(57) ABSTRACT

According to the present invention, contact plugs are formed by a CVD method without deteriorating the properties of the ferroelectric capacitor in a semiconductor device having a fine ferroelectric capacitor. Adhesive film is formed in a contact hole, which exposes an upper electrode of the ferroelectric capacitor after conducting heat treatment in an oxidizing atmosphere, and a W layer is deposited by the CVD method using such TiN adhesive film as a hydrogen barrier and the contact hole is filled.

15 Claims, 12 Drawing Sheets

U.S. PATENT DOCUMENTS

| | | | |
|---|---|---|---|
| 6,046,099 A * | 4/2000 | Cadien et al. | 438/622 |
| 6,107,193 A * | 8/2000 | Shiao et al. | 438/648 |
| 6,169,304 B1 | 1/2001 | Arita et al. | |
| 6,172,386 B1 | 1/2001 | Jung et al. | |
| 6,188,098 B1 | 2/2001 | Amanuma | |
| 6,239,462 B1 | 5/2001 | Nakao et al. | |
| 6,242,299 B1 | 6/2001 | Hickert | |
| 6,281,023 B2 * | 8/2001 | Eastep et al. | 438/3 |
| 6,284,646 B1 | 9/2001 | Leem | |
| 6,291,342 B2 | 9/2001 | Lee et al. | |
| 6,294,805 B1 | 9/2001 | Jung | |
| 6,313,491 B1 * | 11/2001 | Shuto | 257/295 |
| 6,316,275 B2 | 11/2001 | Höpfner | |
| 6,329,234 B1 * | 12/2001 | Ma et al. | 438/210 |
| 6,333,528 B1 | 12/2001 | Arita et al. | |
| 6,355,952 B1 | 3/2002 | Yamoto et al. | |
| 6,395,612 B1 | 5/2002 | Amanuma | |
| 6,429,088 B1 | 8/2002 | Lau | |
| 6,455,410 B2 | 9/2002 | Shimizu | |
| 6,485,988 B2 | 11/2002 | Ma et al. | |
| 6,509,593 B2 | 1/2003 | Inoue et al. | |
| 6,515,323 B1 | 2/2003 | Jung et al. | |
| 6,534,809 B2 | 3/2003 | Moise et al. | |
| 6,579,753 B2 | 6/2003 | Yamanobe | |
| 6,627,996 B1 | 9/2003 | Yokoyama et al. | |
| 6,809,000 B2 * | 10/2004 | Nakao et al. | 438/393 |
| 6,909,625 B2 | 6/2005 | Aratani | |
| 6,911,686 B1 | 6/2005 | Itoh | |
| 7,074,625 B2 | 7/2006 | Itoh | |
| 7,115,994 B2 * | 10/2006 | Yaegashi | 257/758 |
| 7,170,174 B2 * | 1/2007 | Huglin et al. | 257/758 |
| 7,170,176 B2 | 1/2007 | Ishikawa et al. | |
| 2001/0016416 A1 | 8/2001 | Kim | |
| 2001/0018237 A1 | 8/2001 | Hartner et al. | |
| 2001/0023103 A1 | 9/2001 | Yang et al. | |
| 2001/0034106 A1 | 10/2001 | Moise et al. | |
| 2001/0040249 A1 | 11/2001 | Jung | |
| 2002/0033493 A1 | 3/2002 | Yamanobe | |
| 2002/0063274 A1 | 5/2002 | Kanaya et al. | |
| 2003/0001177 A1 | 1/2003 | Okutoh et al. | |
| 2003/0006439 A1 | 1/2003 | Bailey | |
| 2004/0161922 A1 | 8/2004 | Gallagher et al. | |
| 2009/0174984 A1 * | 7/2009 | Tachibana | 361/306.1 |

FOREIGN PATENT DOCUMENTS

| | | |
|---|---|---|
| EP | 0 642 167 A2 | 3/1995 |
| GB | 2 338 595 A | 12/1999 |
| JP | 10-223852 A | 8/1998 |
| JP | 11-87633 A | 3/1999 |
| JP | 11-135736 A | 5/1999 |
| JP | 2000-022090 A | 1/2000 |
| JP | 2000-156470 A | 6/2000 |
| JP | 2001-60669 A | 3/2001 |
| JP | 2001-189433 A | 7/2001 |
| JP | 2001-230382 A | 8/2001 |
| JP | 2001-291843 A | 10/2001 |
| JP | 2002-9256 A | 1/2002 |
| KR | 1998-0006266 A | 3/1998 |
| KR | 2000-0002485 | 1/2000 |

OTHER PUBLICATIONS

Japanese Office Action dated Apr. 11, 2006, issued in corresponding Japanese patent application No. 2001-350323.
Japanese Office Action dated Mar. 27, 2007, issued in corresponding Japanese patent application No. 2001-350323.
Taiwanese Office Action dated Aug. 16, 2007, issued in corresponding Taiwanese patent application No. 91105789.
Hiroyuki Tango, "Semiconductor Process Technology", published by Baifukan, Nov. 30, 1998, pp. 46-47.
Korean Office Action mailed Oct. 30, 2007, issued in corresponding Korean patent application No. 10-2002-0018443.
Nulman et al., Titanium silicide and titanium nitride layers . . . published Jun. 11, 1991, pp. 312-315.
Korean Office Action mailed Jun. 26, 2008, issued in corresponding Korean patent application No. 10-2002-0018443.
Japanese Office Action mailed on Mar. 2, 2010, issued in corresponding Japanese Patent Application No. 2007-138009.

* cited by examiner

SEMICONDUCTOR DEVICE AND METHOD OF MANUFACTURING THE SAME

CROSS-REFERENCE TO RELATED APPLICATIONS

This Application is a divisional of application Ser. No. 10/096,864 filed Mar. 14, 2002; which is based upon and claims priority of Japanese Patent Application No. 2001-350323, filed on Nov. 15, 2001, the entire contents of which are incorporated herein by reference.

BACKGROUND OF THE INVENTION

1. Field of the Invention

The present invention generally relates to semiconductor devices, and more particularly to a semiconductor device having a ferroelectric film.

Semiconductor devices such as so-called Dynamic Random Access Memory (DRAM)s or Static Random Access Memory (SRAM)s are used extensively as a high-speed main memory device in various information processing apparatuses including computers. These semiconductor devices, however, have volatile memories and the information stored therein is lost when the power is turned OFF. Conventionally, nonvolatile magnetic disk units have been used as large-capacity secondary storage devices for storing programs and data.

However, magnetic disk units have disadvantages in that they are bulky and fragile, have large power consumption, and furthermore in that they have low access speed upon reading and writing information. Recently, Electrically Erasable Programmable Read Only Memory (EEPROM)s or flash-memory devices are frequently used for storing information in a floating-gate electrode in the form of electrical charges. Particularly, flash-memory devices tend to have a high integration density because they have cell construction similar to that of DRAM, and are expected to become the large-capacity storage device comparable to a magnetic disk unit.

In EEPROM and flash-memory devices, writing of information is achieved by injecting hot electrons through a tunneling insulation film into the floating gate electrode. Thus, a flash-memory device has drawbacks in that it inevitably takes a substantial time for writing and tunneling insulation film deteriorates after writing and erasing operations are repeated a number of times. When tunneling insulation film is deteriorated, operations of writing and erasing become unstable.

In view of the above, a ferroelectric memory device (designated hereinafter as FeRAM) for storing information in a ferroelectric film in the form of a spontaneous polarization is proposed. In such FeRAM, an individual memory cell transistor, consisting of a single MOSFET as in the case of DRAM, comprises a structure in which dielectric film in the memory cell capacitor is replaced by ferroelectric material such as PZT (Pb(Zr, Ti)O$_3$) or PLZT(Pb(Zr,Ti,La)O$_3$), and furthermore, SBT(SrBi$_2$Ta$_2$O$_3$), or SBTN (SrBi$_2$(Ta,Nb)$_2$O$_3$); and it becomes possible to integrate at high integration density. Moreover, FeRAM has an advantageous feature that because it controls the spontaneous polarization of the ferroelectric capacitor by applying an electric field, writing operation is achieved with a high speed, faster by a factor of 1000 or more than the EEPROM or flash-memory devices which carries out writing by injecting hot electrons, and the power consumption is reduced to about 1/10 compared to the EEPROM or flash-memory device. Furthermore, lifespan is longer because there is no need to use the tunneling oxide film; the FeRAM device can be erased 10 million times or more.

2. Description of the Related Art

FIG. 1 shows a structure of FeRAM 10 disclosed in a Japanese Laid-Open Patent Application No. 2000-156470.

Referring to FIG. 1, FeRAM 10 is formed on a Si substrate 11 in correspondence to an active region defined by a device isolating insulation film 12. FeRAM 10 includes gate electrode 13 formed on the Si substrate 11 via gate insulation film not shown in the Figure, and diffusion regions 11A and 11B formed on either side of the gate electrode 13 in the Si substrate 11.

Interlayer insulation film 14 is formed on the Si substrate 11 so as to cover the gate electrode 13. A ferroelectric capacitor in which a lower electrode 15, a ferroelectric film 16, and an upper electrode 17 are consecutively layered is formed on the interlayer insulation film.

The ferroelectric capacitor is covered with a separate interlayer insulation film 18 formed on the interlayer insulation film 14. Contact holes 18A, 18B that pass through the interlayer insulation film 14 and expose diffusion regions 11A and 11B, respectively, are formed in the interlayer insulation film 18. Additionally, contact hole 18C exposing the lower electrode 15, and contact hole 18D exposing the upper electrode 17 are formed in the interlayer insulation film 18.

In FeRAM 10 of FIG. 1, contact holes 18A through 18D are filled with contact plugs 19A through 19D, respectively, with a consecutively layered structure of TiN film, Al—Cu film, TiN film and WSi film. Furthermore, interconnecting patterns contacting the contact plugs are formed on the interlayer insulation film 18.

Recently in particular, conductive oxide such as IrOx or SrRuOx is frequently used as the upper electrode of the ferroelectric capacitor used in FeRAM. Such conductive oxide is similar to ferroelectric film consisting of oxide in terms of chemical and crystallographic properties, and is convenient in optimizing the electrical property of ferroelectric film.

In the FeRAM 10 of FIG. 1, contact plugs 19A through 19D are formed by a sputtering method. However, in the sputtering method, if a semiconductor device is miniaturized, step coverage in contact holes 18A through 18D easily form defects and a problem of yield and reliability arises.

In a general semiconductor device, such contact plugs are frequently formed by depositing a W layer by means of a Chemical Vapor Deposition (CVD) method, and then removing the W layer on the insulation film by means of a Chemical Mechanical Planarization (CMP) method. It is possible to securely fill the contact holes with W plugs by the CVD method even in contact holes where the aspect ratio is large.

However, in semiconductors with ferroelectric film such as FeRAM, attempts to deposit a W layer by means of the CVD method develop a problem where H$_2$ contained in the atmosphere during deposition acts on the ferroelectric film and reduces the ferroelectric film. When ferroelectric film is reduced, the electrical property with a characteristic of desired hysteresis is lost.

In an attempt to avoid this problem, steps of forming W plugs for diffusion regions, and then forming contact plugs for the ferroelectric capacitor can be considered.

In FeRAM 10 of FIG. 1, it may be considered to, for example, first form contact holes 18A and 18B, and then after filling the contact holes 18A, 18B with W plugs 19A and 19B, respectively, to form contact holes 18C, 18D. According to such staging, in the formation of W plugs 19A and 19B, a ferroelectric film 16 is sealed by interlayer insulation film 18 and the problem of ferroelectric film reduction can be avoided.

In such a method, however, it is necessary to form contact holes 18C and 18D in the ferroelectric capacitor by a dry etching method. This dry etching method involves, especially if upper electrode 17 is formed by conductive oxide film, the upper electrode 17 and ferroelectric film 16 underlying the upper electrode will be partially reduced, and a problem of oxygen defect arises.

For this reason, in the case where contact holes 18C and 18D are formed afterward, heat treatment in the oxidizing atmosphere to compensate for oxygen defect is necessary. However, when conducting heat treatment in the oxidizing atmosphere, previously formed W plugs 19A and 19B oxidize, and a problem concerning increase in contact resistance arises.

SUMMARY OF THE INVENTION

Accordingly, it is a general object of the present invention to provide a novel and useful semiconductor device that solves the above discussed problems and a method of manufacturing the same.

More particularly, it is a specific object of the present invention to provide a method of manufacturing a semiconductor device having a ferroelectric capacitor, which method forms contact plugs that contact the upper electrode of the ferroelectric capacitor, by means of the CVD method without oxidizing the conductor contact plugs composed of a material such as W, while suppressing the reduction of ferroelectric film in the ferroelectric capacitor. A further object of the present invention is to provide a semiconductor device formed from such manufacturing method.

The above object is achieved by providing a semiconductor device having a semiconductor substrate; a transistor formed on the semiconductor substrate and including a diffusion region formed in the semiconductor substrate; a capacitor formed on the semiconductor substrate, and having a consecutively layered structure of a lower electrode, a ferroelectric film, and an upper electrode; an insulation film formed on the semiconductor substrate so as to cover the capacitor; a first contact hole formed in the insulation film so as to expose the upper electrode of the capacitor; a second contact hole formed in the insulation film so as to expose the diffusion region; a first conductive plug formed in the first contact hole; and a second conductive plug formed in the second contact hole; a conductive nitride film is formed between the first conductive plug and the upper electrode so as to contact a inner wall of the first contact hole and a surface of the upper electrode.

The present invention further achieves the above object by providing a method of manufacturing a semiconductor device comprising a semiconductor substrate, a transistor formed on the semiconductor substrate and including a diffusion region formed in the semiconductor substrate; a ferroelectric capacitor formed on the semiconductor substrate and having a consecutively layered structure of a lower electrode, a ferroelectric film, and an upper electrode; wherein the method comprises the steps of: (a) forming an insulation film on the semiconductor substrate so as to cover the ferroelectric capacitor; (b) forming a first contact hole and a second contact hole on the insulation film so as to expose the upper electrode and the lower electrode, respectively; (C) conducting heat treatment on the ferroelectric capacitor in an oxidizing atmosphere; (d) forming a third contact hole in the insulation film so as to expose the diffusion region; (e) forming a conductive nitride film on the insulation film so as to cover the first, second, and third contact holes; and (f) forming a conductive layer on the conductive nitride film so that the conductive layer fills the first, second, and third contact holes.

DESCRIPTION OF THE PREFERRED EMBODIMENTS

The inventor of the present invention has recognized through experiments constituting the basis of the present invention that conductive nitride film acts as an effective hydrogen barrier. In view of the above, the present invention thus proposes to form a conductive nitride film in contact holes exposing upper and lower electrodes of the ferroelectric capacitor after conducting heat treatment in the oxidizing atmosphere that accompanies the formation of contact holes. The problem of a hydrogen atmosphere acting on the ferroelectric capacitor via the contact holes and deteriorating the electric properties can be avoided during the subsequent CVD process that uses a hydrogen atmosphere by forming conductive nitride film in contact holes as described above. It is thus possible through the CVD method, a preferred method for step coverage, to form a low resistance metal plug that fills the contact hole or contact holes exposing diffusion regions, and is also possible to manufacture the semiconductor device without introducing a deterioration of properties.

First Embodiment

Figure 1:
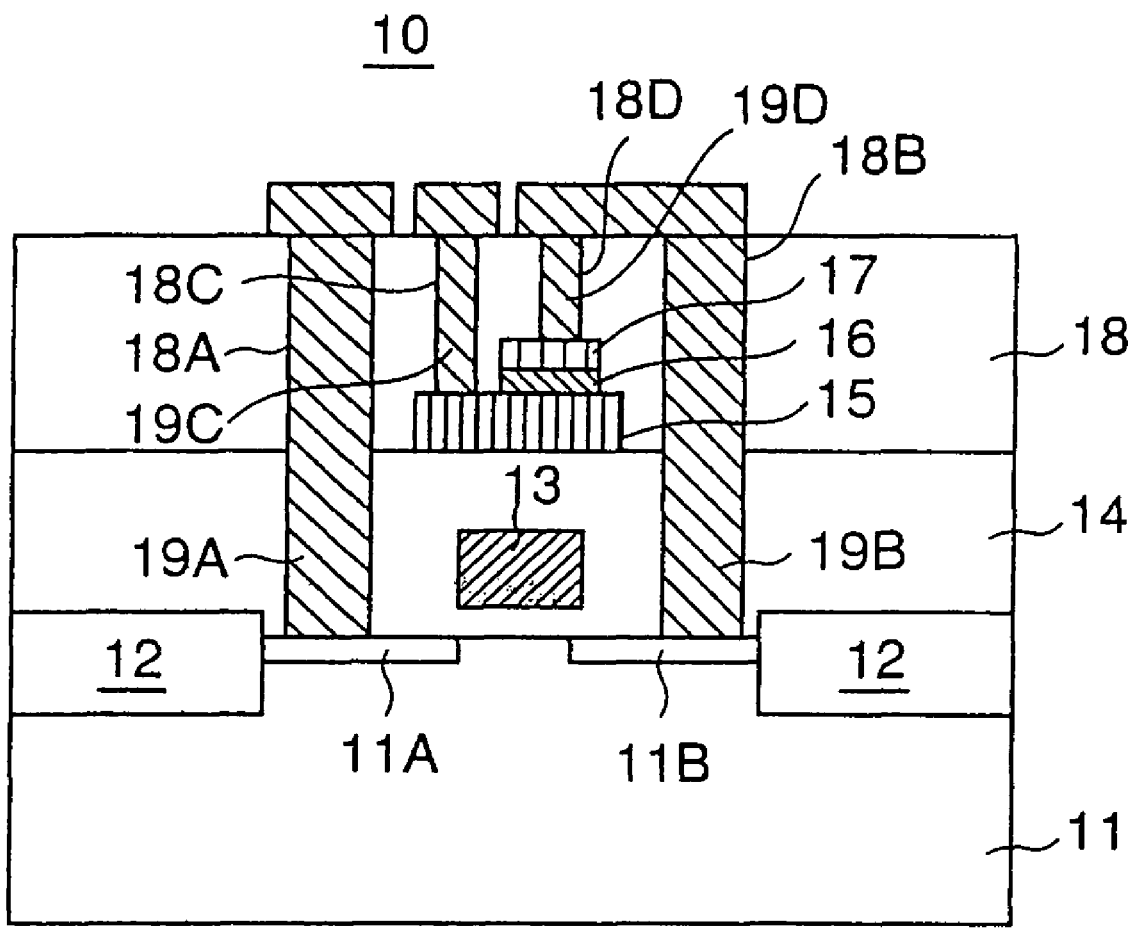
FIG. 1 is a diagram showing a structure of a conventional FeRAM.
Figure 2:
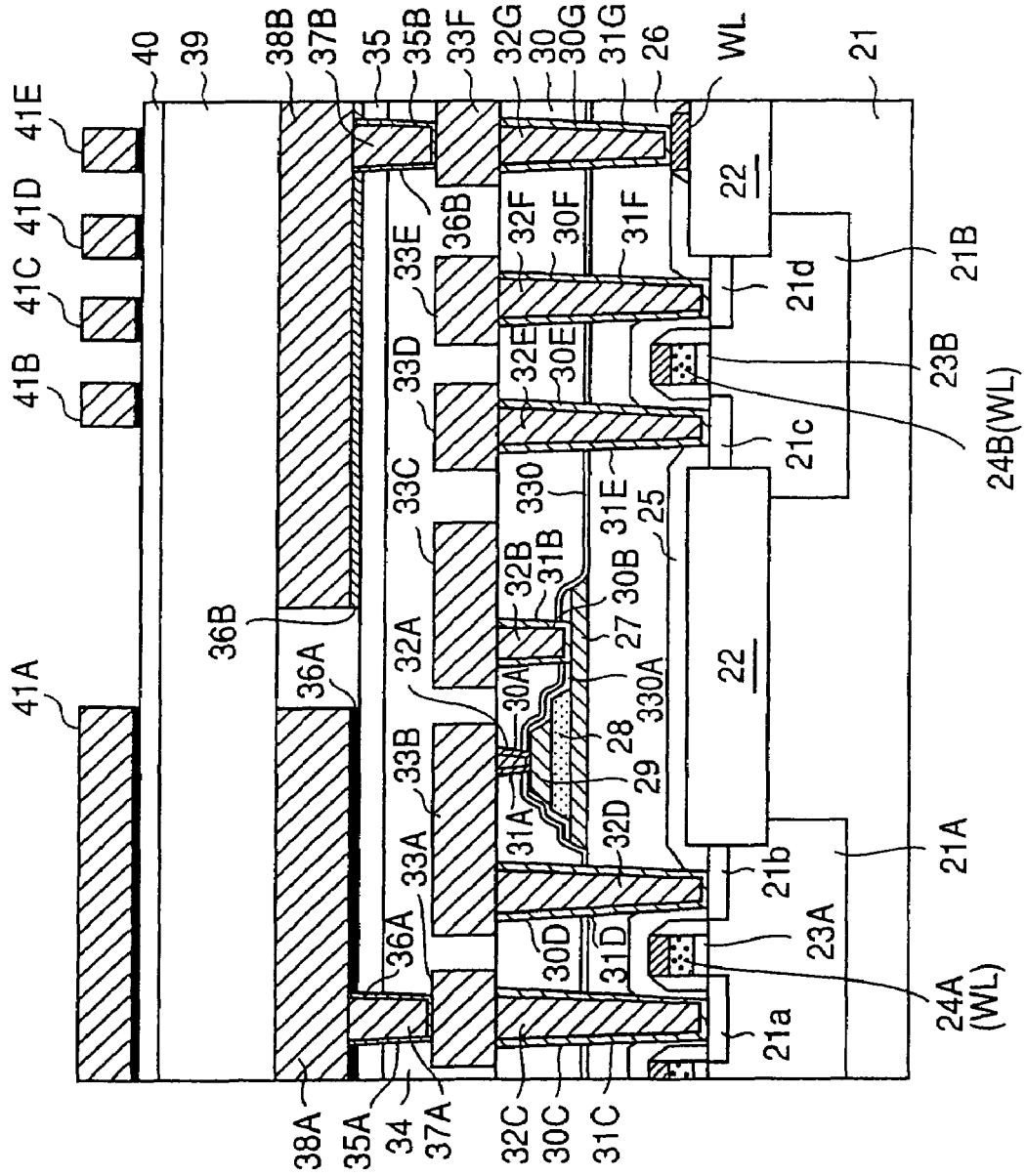
FIG. 2 is a diagram showing a structure of a FeRAM according to a first embodiment of the present invention.

FIG. 2 shows a construction of FeRAM 20 according to a first embodiment of the present invention.

Referring to FIG. 2, FeRAM 20 is formed on a Si substrate 21 which may either be of p-type or of n-type, and which has a p-type well 21A and an n-type well 21B defined by field insulation film 22. A gate electrode 24A of polycide structure is formed on the p-type well 21A through gate insulation film 23A. Similarly, a gate electrode 24B of polycide structure is formed on the n-type well 21B through gate insulation film 23B. Furthermore, in the p-type well 21A, n-type diffusion regions 21$a$, 21$b$ are formed on either side of the gate electrode 24A, and in the n-type well 21B, p-type diffusion regions 21$c$, 21$d$ are formed on either side of the gate electrode 24B. The gate electrode 24A extends over the field oxide film 22 outside the active region and constitutes part of a word line (WL) of FeRAM.

Each gate electrode 24A, 24B has a sidewall insulation film, and is covered with a SiON cover film 25 formed on the Si substrate 21 by a CVD method with a thickness of about 200 nm so as to cover the field insulation film 22.

The cover film 25 is further covered with a SiO$_2$ interlayer insulation film 26 with a thickness of about 1 µm and formed by a CVD method using TEOS gas as the precursor. The surface of the interlayer insulation film 26 is then planarized by a CMP method.

A ferroelectric capacitor having a consecutively layered structure is formed on the planarized surface of the interlayer insulation film 26, wherein this structure includes a lower electrode 27 in which a Ti film with a thickness of between 10 to 30 nm, preferably about 20 nm and a Pt film with a thickness of between 100 to 300 nm, preferably about 175 nm are consecutively layered; a ferroelectric capacitor insulation film 28 consisting of PZT(Pb(Zr,Ti)O$_3$) or PZLT((Pb,La)(Zr, Ti)O$_3$) with a thickness of between 100 to 300 nm, preferably about 240 nm; and an upper electrode 29 consisting of IrOx with a thickness of between 100 to 300 nm, preferably about 200 nm and formed on the ferroelectric capacitor insulation film 28. The Ti film and Pt film are formed typically by sputtering, and the ferroelectric capacitor insulation film 28 is crystallized typically by conducting rapid heat treatment for 20 seconds at 725° C. in an oxidizing atmosphere after sputtering. Preferably, ferroelectric film 28 is added with Ca and Sr, and can be formed by methods other than sputtering such as the spin-on method, sol-gel method, metal organic deposition (MOD) method or MOCVD method. It is also possible to use other films such as SBT(SrBi$_2$(Ta,Nb)$_2$O$_9$) film, or BTO(Bi$_4$Ti$_2$O$_{12}$) film for ferroelectric capacitor insulation film 28 instead of PZT or PLZT film. Furthermore, it is possible to form DRAM by using high dielectric film such as BST ((Ba,Sr)TiO$_3$) film or STO(SrTiO$_3$) film instead of ferroelectric capacitor insulation film 28. IrOx film constituting the upper electrode 29 is then formed typically by sputtering. It is still possible to use Pt film or SRO (SrRuO$_3$) film for the upper electrode 29 instead of IrOx film.

The ferroelectric capacitor formed in this manner is covered with an encapsulating layer 330A of Al$_2$O$_3$ with a thickness of about 50 nm, and formed by the sputtering method under ordinary temperature. This encapsulating layer 330A is covered with a separate encapsulating layer 330 of Al$_2$O$_3$ with a thickness of about 20 nm, formed on the interlayer insulation film 26 by sputtering.

SiO$_2$ interlayer insulation film 30 whose thickness is about 400 nm from the top of the upper electrode is formed on the encapsulating layer 330 by a CVD method, preferably the plasma CVD method which uses polysilane compound such as SiH$_4$, Si$_2$F$_6$, Si$_3$F$_8$, Si$_2$F$_3$Cl or SiF$_4$, or TEOS as precursors. Contact holes 30A, 30B exposing the upper electrode 29 and the lower electrode 27, respectively, are formed in the interlayer insulation film 30. Contact holes 30C, 30D, 30E and 30F exposing diffusion regions 21a, 21b, 21c, and 21d, respectively, and extending through the interlayer insulation film 26 are also formed. Furthermore, a contact hole 30G exposing a word line pattern WL formed on the element isolating film 22 is formed through the interlayer insulation film 30.

In this embodiment, an adhesive film 31A 31B with a thickness of about 50 nm and consisting of conductive nitride such as TiN is formed in each contact hole 30A and 30B so as to directly contact the inner wall planes of the respective contact holes and to directly contact the surface of the upper electrode 29 or the lower electrode 27. In contact hole 30A, a conducting plug 32A consisting of W is formed on the TiN adhesive film 31A, and in contact hole 30B, a conducting plug 32B consisting of W is formed on the TiN adhesive film 31B, both through CVD method using mixed gas of WF$_6$, Ar, and H$_2$. In this embodiment, TiN adhesive films 31C through 31G are formed on the inner wall plane of contact holes 30C through 30G, respectively, in the same manner, and W plugs 32C through 32G are formed on the TiN adhesive films 31C through 31G, respectively, to fill the respective contact holes.

Interconnect patterns 33A through 33F consisting of Al are formed on the interlayer insulation film 30 in correspondence to each W plug 32A through 32G, and the interconnect patterns 33A through 33F are covered with a next interlayer insulation film 34 consisting of SiO$_2$ formed by plasma CVD method. Similar to the interlayer insulation film 30, the interlayer insulation film 34 can be formed using polysilane compound such as SiH$_4$, Si$_2$F$_6$, Si$_3$F$_8$, or SiF$_3$Cl, or TEOS as precursors.

Furthermore, a protective insulation film 35 consisting of SiO$_2$ with a thickness of more than 100 nm is formed on the interlayer insulation film 34 by CVD method. The protective insulation film 35 formed in this way covers the slit (cavity) exposed by planarization stage (CMP), which follows the formation of interlayer insulation film 34.

Contact holes 35A, 35B, which pass through the protective insulation film 35 and expose interconnect patterns 33A and 33F, are formed in the interlayer insulation film 34. Furthermore, W plugs 37A, 37B are formed on the inner wall plane of contact holes 35A, 35B through TiN adhesive films 36A and 36B.

Furthermore, interconnect patterns 38A, 38B consisting of Al or Al alloy, which contact the W plugs 37A, 37B are formed on the protective insulation film 35. TiN adhesive films 36A, 36B covering the inner wall planes of the contact holes 35A, 35B then extend between the interconnect patterns 38A or 38B and the protective insulation film 35.

The interconnect patterns 38A, 38B are covered with an interlayer insulation film 39 formed in a similar way as the interlayer insulation film 30 or 34. The interlayer insulation film 39 is covered with a protective insulation film 40 similar to the protective insulation film 35, and interconnect patterns 41A through 41E including a bit line (BL) are formed on the protective insulation film 40.

The inventor of the present invention has recognized through experiments constituting the basis of the present invention, that upon forming W plugs 32A, 32B for contact holes 30A, 30B respectively, by covering the inner wall planes and the bottom planes of contact holes 30A, 30B continuously with respective TiN films 31A and 31B, entering of hydrogen into the upper electrode 29 and the ferroelectric film 28 can be effectively suppressed, and furthermore deterioration in electrical properties of the ferroelectric film 28 can be effectively suppressed when W plugs 32A, 32B are formed through CVD method using mixed gas of WF$_6$, Ar and H$_2$. On the other hand, when using a film with a conventional layered structure of Ti film and TiN film for the adhesive film covering the inner wall planes and the bottom planes of the related contact holes, particularly contact hole 30A exposing the upper electrode 29, it can be observed that contact resistance increases significantly. This is shown in the table below.

| contact metal for upper electrode and S/D | S/D contact resistance | contact resistance of upper electrode |
|---|---|---|
| TiN (50 nm)/Ti (20 nm) | 7.7 | 61.1 |
| TiN (50 nm) | 8.3 | 8.0 |

Referring to Table 1, it can be seen that when adhesive film with a layered structure of Ti film with a thickness of 20 nm and TiN film with a thickness of 50 nm was used, the contact resistance in contact hole 30C or 30D exposing diffusion region 21a or 21b was 7.7 Ω/via, whereas the contact resistance in contact hole 30A exposing upper electrode 29 was increased to 61.1 Ω/via.

As opposed to this, when Tin film with a thickness of 50 nm was used, contact resistance was 8.0-8.3 Ω/via in both contact holes, and increase of contact resistance in contact hole 30A was not observed.

It is possible to consider that when layered film of Ti film and TiN film is used, the reaction

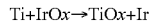

$$Ti + IrOx \rightarrow TiOx + Ir$$

takes place when Ti film contacts the IrOx upper electrode 29, and the TiOx film formed as a result causes the contact resistance to increase. To the contrary, if only TiN film is used for the adhesive film, such reaction will not take place and thus the contact resistance will not increase.

TiN film has a composition represented by TiNx, and ideally has a stoichiometric composition represented by $Ti_3N_4$. Accordingly, it is considered that suppression effect against increase in contact resistance appear significantly as the composition of TiN adhesive film becomes closer to the above stoichiometric composition. Furthermore, the suppression effect against increase in contact resistance that accompany the use of TiN adhesive film is not limited to the case in which the upper electrode 29 is an IrOx film, but is considered also effective with conductive oxide film such as SrRuOx film.

Second Embodiment

Here, the manufacturing steps of FeRAM of FIG. 2 are explained as a second embodiment of the present invention with reference to FIG. 3A through FIG. 3I. In the figures, components corresponding to those described earlier have identical reference numbers and thus their explanations are omitted.

Figure 3A:
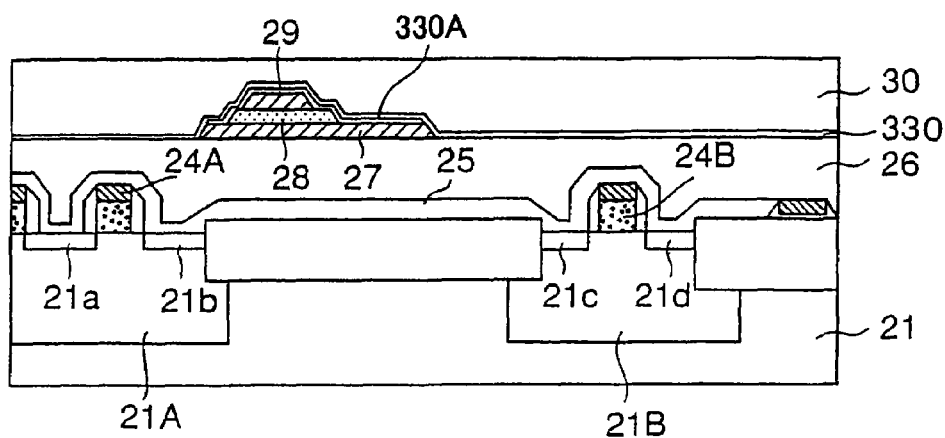
FIGS. 3A-3I are diagrams showing the manufacturing steps of a FeRAM according to a second embodiment of the present invention.

Referring to FIG. 3A, $SiO_2$ interlayer insulation film 26 is formed with a thickness of about 1 μm on a Si substrate 21, which is formed with diffusion regions 21a through 21d and having polycide gate electrodes 24A, 24B, by plasma CVD method using TEOS as the precursor so as to cover the gate electrodes 24A, 24B. The interlayer insulation film 26 is planarized by CMP method. Ti film and Pt film with a thickness of 20 nm and 175 nm respectively are consecutively deposited, and as previously mentioned, ferroelectric film with a thickness of 240 nm added preferably with Ca and Sr is formed thereon by sputtering. The PLZT film formed in this way is crystallized by conducting rapid heat treatment for 20 seconds at 725° C. with a temperature rise of 125° C./sec. in an oxidizing atmosphere.

After the ferroelectric film is crystallized, IrOx film with a thickness of 200 nm is formed on the ferroelectric film by sputtering.

IrOx formed in this way is patterned by a resist process, and the upper electrode 29 is formed. After the resist process, the ferroelectric film is subjected to heat treatment for 60 minutes at 650° C. in the oxidizing atmosphere again, and defects produced in the ferroelectric film during the sputtering stage and the patterning stage of IrOx film are compensated for.

Next, a resist pattern including the upper electrode 29 is formed and the ferroelectric film is patterned using such resist pattern as the mask. The ferroelectric capacitor insulation film 28 is then formed. After the ferroelectric capacitor insulation film 28 is formed, the interlayer insulation film 26 is dehydrated by further conducting heat treatment in a nitrogen atmosphere.

Furthermore, encapsulating layer 330A for protecting ferroelectric capacitor insulation film 28 from $H_2$ is formed by sputtering $Al_2O_3$ film at ordinary temperature so as to cover the ferroelectric capacitor insulation film 28 and the upper electrode 29. It is also possible to deposit PZT film, PLZT film or TiOx film instead of $Al_2O_3$ film for the encapsulating layer film 330A. After encapsulating layer 330A is formed, heat treatment is conducted for 60 minutes at 550° C. in an oxidizing atmosphere enhancing the film property of strong encapsulating layer 330A.

Furthermore, a resist pattern is formed on the encapsulating layer 330A, and Pt/Ti layer is patterned using such resist pattern as the mask and the lower electrode 27 is formed.

The resist pattern used during patterning of lower electrode 27 is removed, and the lower electrode is subjected to heat treatment for 30 minutes at 350° C. The encapsulating layer 330 is formed on the interlayer insulation layer 26 by sputtering $Al_2O_3$ in a manner so that encapsulating layer 330 covers the underlying encapsulating layer 330A.

In the step shown in FIG. 3A, after forming the encapsulating layer 330, heat treatment is conducted for 30 minutes at 650° C. in the oxidizing atmosphere, compensating for the damage caused in the ferroelectric capacitor insulation film 28. Furthermore, as previously described, interlayer insulation film 30 with a thickness of about 1200 nm is formed on the encapsulating layer 330 through a plasma CVD method using a polysilane compound such as $SiH_4$, $Si_2F_6$, $Si_3F_8$ or $Si_2F_3Cl$, or $SiF_4$ as precursors. It is also possible to form interlayer insulation film 30 using TEOS as the precursor. Moreover, the thermal excitation CVD method and laser excitation CVD method may be used besides plasma CVD method. After the interlayer insulation film 30 is formed, it is polished until the thickness measured from the surface of the upper electrode 29 amounts to about 400 nm, and then planarized.

Figure 3B:
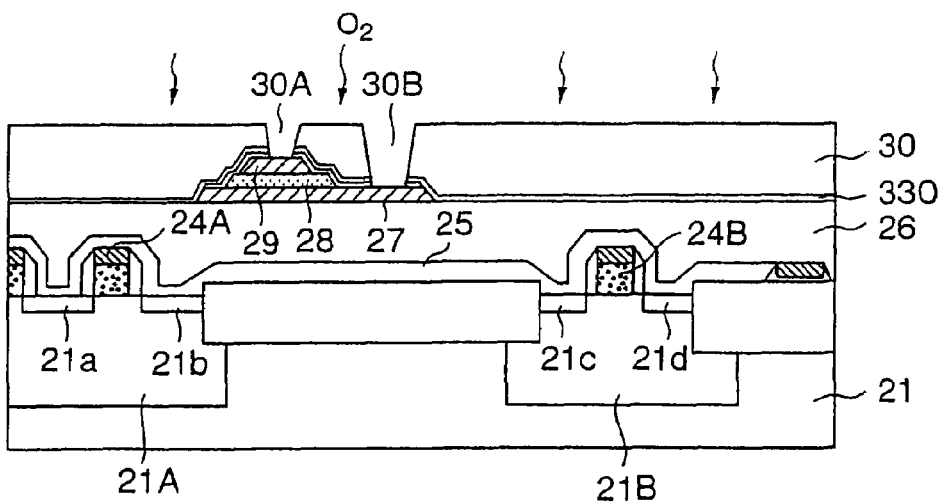

In the step shown in FIG. 3B, after the stage in which the interlayer insulation film 30 is dehydrated using $N_2$ plasma or $N_2O$ plasma, contact holes 30A and 30B, which pass through the encapsulating layers 330 and 330A and expose the upper electrode 29 and lower electrode 27, respectively, are formed in the interlayer insulation film 30 by a resist process using mixed gas of $CHF_3$, $CF_4$, and Ar.

In the step shown in FIG. 3B, the structure formed is subjected to heat treatment for 60 minutes at 550° C. in the oxidizing atmosphere, and the deterioration in quality of the insulation film 28 of ferroelectric capacitor that accompanies the formation of contact holes 30A and 30B is recovered.

Figure 3C:
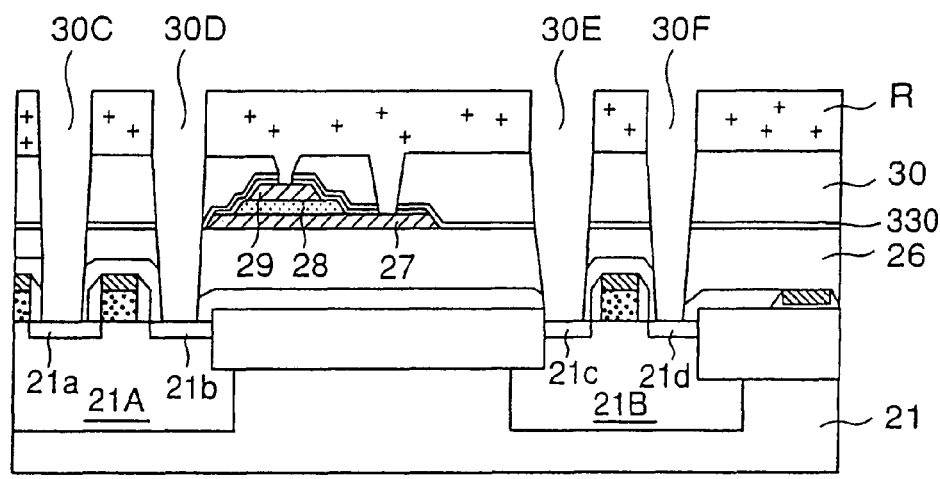

In the step shown in FIG. 3C, resist pattern R having openings corresponding to contact holes 30C through 30F are formed on the structure in FIG. 3B. Interlayer insulation films 30 and 26 as well as the encapsulating layer 330 interposed in between are patterned using resist pattern R as the mask, forming contact holes 30C through 30F, which expose diffusion regions 21a through 21d respectively. In FIG. 3C and in the following description, the formation of contact hole 30G shown in FIG. 2 is not shown for its formation can easily be understood.

Figure 3D:
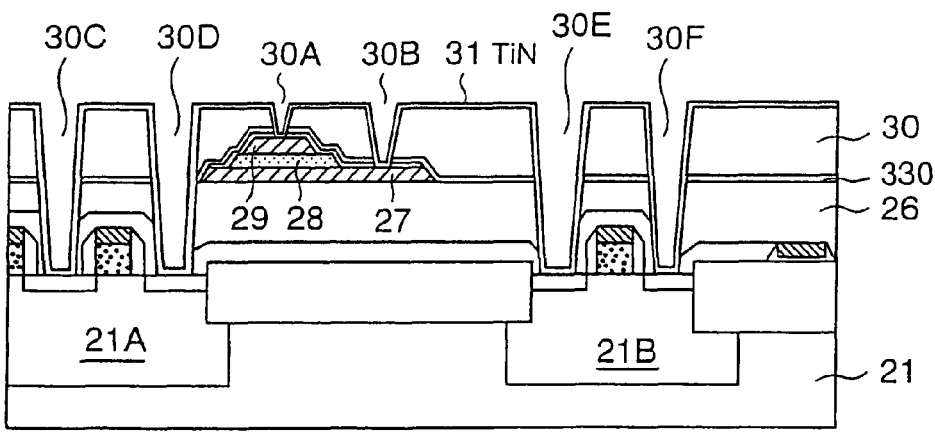

In the step shown in FIG. 3D, the resist pattern is removed, and Tin film 31 with a thickness of about 50 nm is formed on the interlayer insulation film 30 after carrying out the preliminary treatment by Ar plasma etching, so that TiN film 30 continuously covers the inner wall plane and the bottom plane of contact hole 30A, as well as the inner wall plane and the bottom plane of contact hole 30B. Such TiN film contacts the exposed part of the upper electrode 29 at the bottom plane of contact hole 30A, and contacts the exposed part of the lower electrode 27 at the bottom plane of contact hole 30B. TiN film 31 also contacts the exposed diffusion regions 21a through 21d at contact holes 30C through 30F, respectively.

Figure 3E:
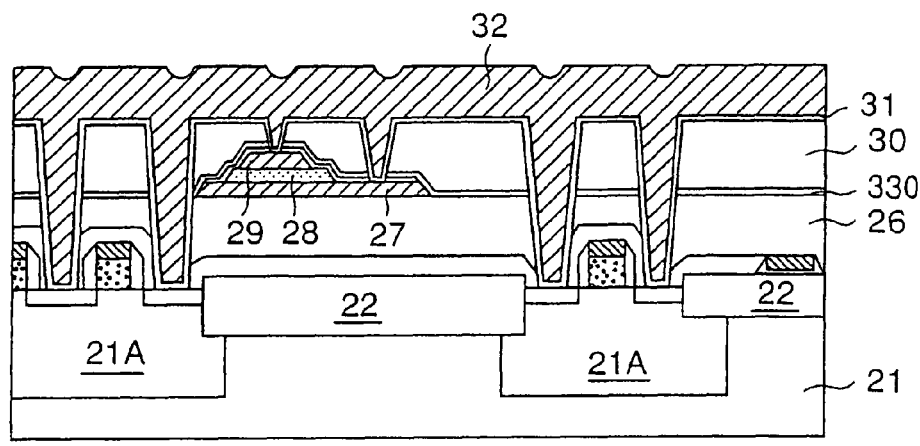

In the step shown in FIG. 3E, W layer 32 is deposited on the TiN film 31 in the structure in FIG. 3D so as to fill the respective contact holes 30C through 30F by a CVD method using $WF_6$, Ar, and $H_2$.

In the step shown in FIG. 3E, although $H_2$ is used in the CVD stage of W layer, $H_2$ will not reach the ferroelectric film 28 because the entire ferroelectric capacitor including the ferroelectric film 28 is continuously covered with TiN film 31 in the structure shown in FIG. 3E, and thus the problem of deterioration in the property of ferroelectric capacitor due to reduction is avoided.

Figure 3F:
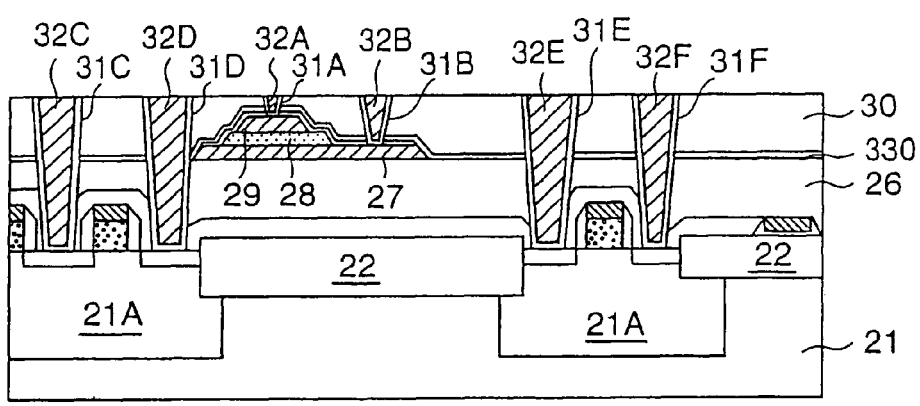

In the step shown in FIG. 3F, the W layer 32 on the interlayer insulation film 30 is polished and removed. Consequently, W plugs 32A through 32F are formed from the remaining part of the W layer in the contact holes 30A through 30F, respectively. As a result of such CMP process, the TiN film 31 is planarized and TiN patterns 31A through 31F are formed in correspondence to contact holes 30A to 30F.

Among the W plugs 32A through 32F formed in this way, W plug 32A contacts the upper electrode 29 consisting of IrOx through the TiN pattern 31A. However, as explained above with reference to table 1, TiN pattern will not react with conductive oxide such as IrOx and thus will not increase the contact resistance.

Figure 3G:
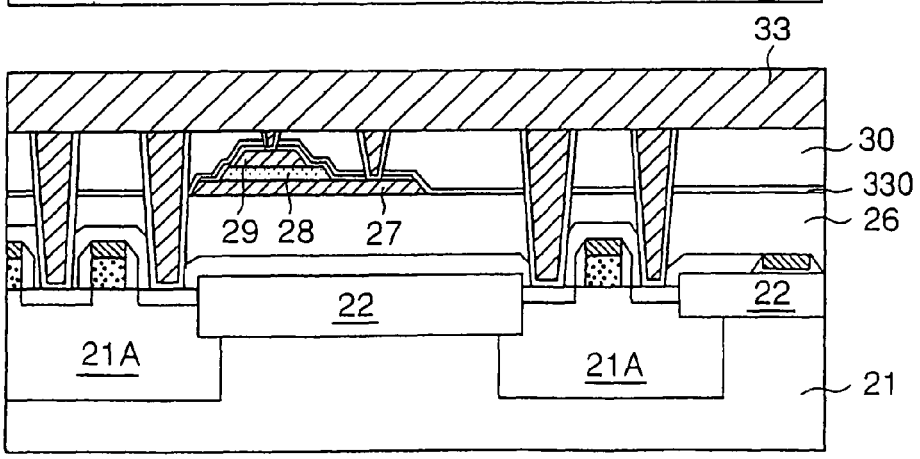

In the step shown in FIG. 3G, a dehydration process and film quality improvement process with $N_2$ is carried out for the interlayer insulation film 30. After the surface of each of contact holes 32A through 32F is cleaned by RF etching, conductive layer 33 with a layered structure of TiN film with a thickness of 50 nm, Al—Cu alloy film with a thickness of 5 nm, and TiN film with a thickness of 100 nm is formed on the interlayer insulation film 30 by sputtering.

Figure 3H:
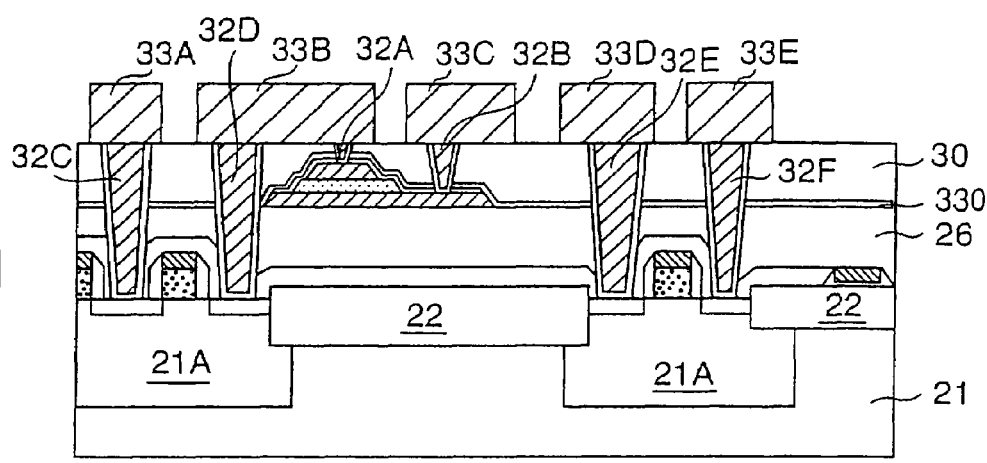

In the step shown in FIG. 3H, the conductive layer 33 formed in this way is patterned to form interconnect patterns 33A through 33E in correspondence to contact plugs 32A through 32F.

Figure 3I:
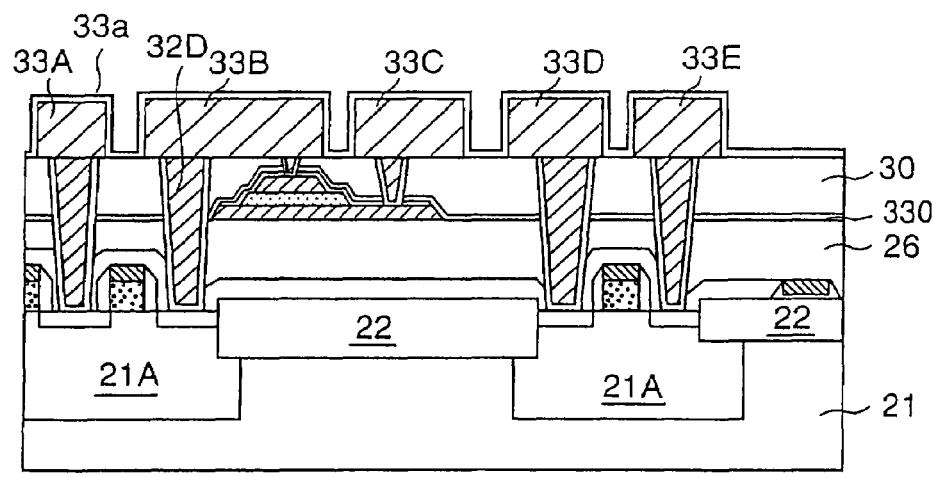

In the step shown in FIG. 3I, cover film 33a consisting of $Al_2O_3$ is formed on the structure in FIG. 3H by sputtering.

Furthermore, the next interlayer insulation film is formed on the structure in FIG. 3I, and it is possible to form the interconnect layer of the upper layer by repeating the steps shown in FIG. 3G through FIG. 3I.

In this embodiment, after W layer 32 is formed, a heat treatment stage in an oxidizing atmosphere is not conducted and thus the problem concerning increase in contact resistance due to oxidation of W plugs 32A through 32F will not arise.

Third Embodiment

Figure 4A:
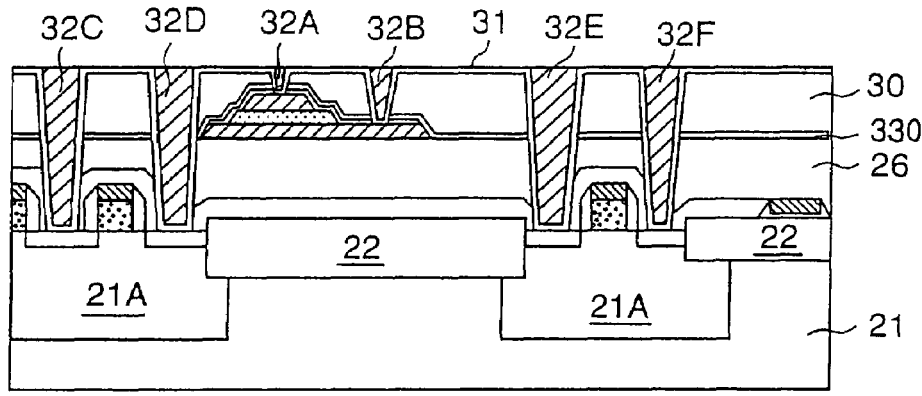
FIGS. 4A-4C are diagrams showing the manufacturing steps of a FeRAM according to a third embodiment of the present invention.
Figure 4B:
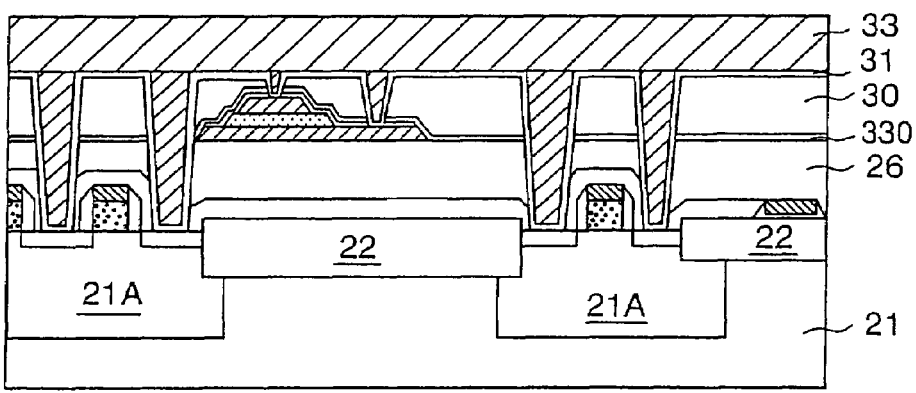
Figure 4C:
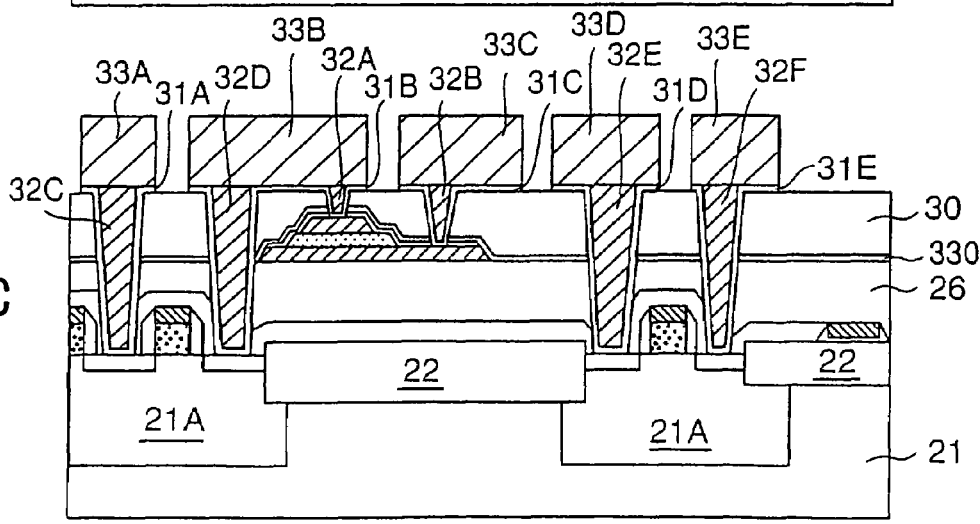

FIG. 4A through FIG. 4C show a method of manufacturing FeRAM according to a third embodiment of the present invention, wherein similar components have identical reference numbers and thus their explanations are omitted.

This embodiment is a variant of the previous embodiment and the step shown in FIG. 4A is carried out in succession to the step shown in FIG. 3E.

Regarding this embodiment, in the step shown in FIG. 4A, W layer 32 covering the TiN film 31 on the interlayer insulation film 30 is selectively removed by etch back using dry etching. In the step shown in FIG. 4A, TiN film 31 remains on the interlayer insulation film 30 in a continuously extending manner. The ferroelectric capacitor, therefore, is covered with TiN film 31 and thus the ferroelectric film 28 of ferroelectric capacitor will not be deteriorated even if the etch back stage is performed.

In the step shown in FIG. 4B, a conductive layer 33 is formed on the structure in FIG. 4A by depositing Al—Cy alloy film, Ti film, and TiN film with respective thickness of 500 nm, 5 nm, and 100 nm. In the step shown in FIG. 4C, the conductive layer 33 is patterned, and interconnect patterns 33A through 33E are formed. In the step shown in FIG. 4C, with the patterning of interconnect patterns 33A through 33E, TiN film 31 is also patterned, forming TiN patterns 31A through 31E corresponding to interconnect patterns 33A through 33E.

In this embodiment as well, deterioration will not occur after W plugs 32A through 32F are formed because the ferroelectric capacitor is covered with TiN film for preventing $H_2$ from entering. Furthermore, heat treatment will not be conducted in the oxidizing atmosphere and the problem concerning increase in contact plug resistance will not arise.

Fourth Embodiment

FIG. 5A through FIG. 5H show a method of manufacturing FeRAM according to a fourth embodiment of the present invention. In the figures, components identical to those described earlier have identical reference numbers and thus their explanations are omitted.

Figure 5A:
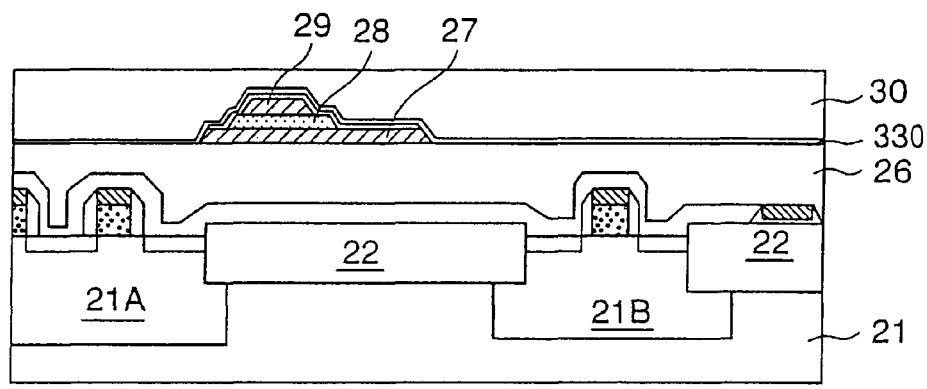
FIGS. 5A-5H are diagrams showing the manufacturing steps of a FeRAM according to a fourth embodiment of the present invention.
Figure 5B:
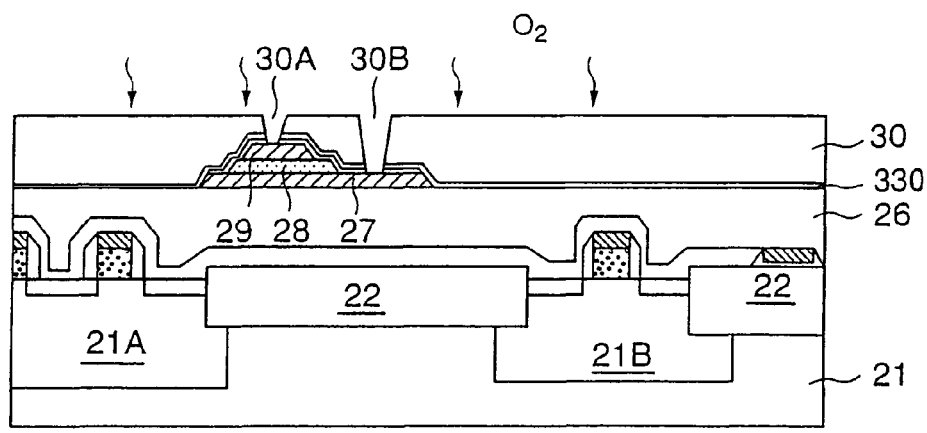

FIG. 5A and FIG. 5B correspond to the steps shown in FIG. 3A and FIG. 3B. The ferroelectric capacitor formed on the interlayer insulation film 26 is covered with the interlayer insulation film 30, and the deterioration in the quality of the ferroelectric film 28 is compensated for by conducting heat treatment in the oxidizing atmosphere after the contact hole 30A exposing upper electrode 29 and the contact hole 30B exposing the lower electrode 27, respectively, are formed.

Figure 5C:
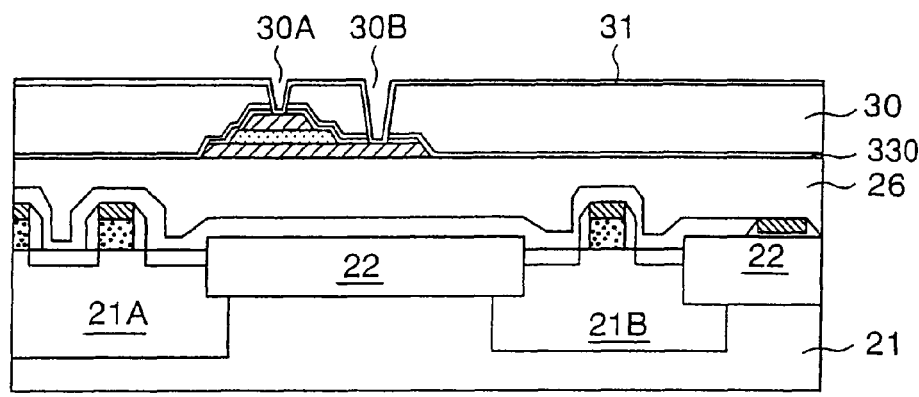

In the step shown in FIG. 5C, TiN film 31 is formed on the structure in FIG. 5B by sputtering so as to cover the interlayer insulation film 30 continuously. In the step shown in FIG. 5D, TiN film 31 is patterned and TiN pattern 31a is formed on the ferroelectric capacitor.

Figure 5D:
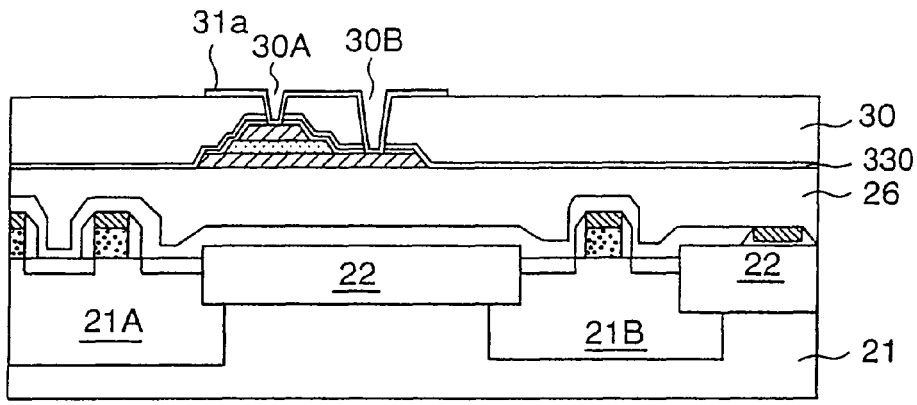
Figure 5E:
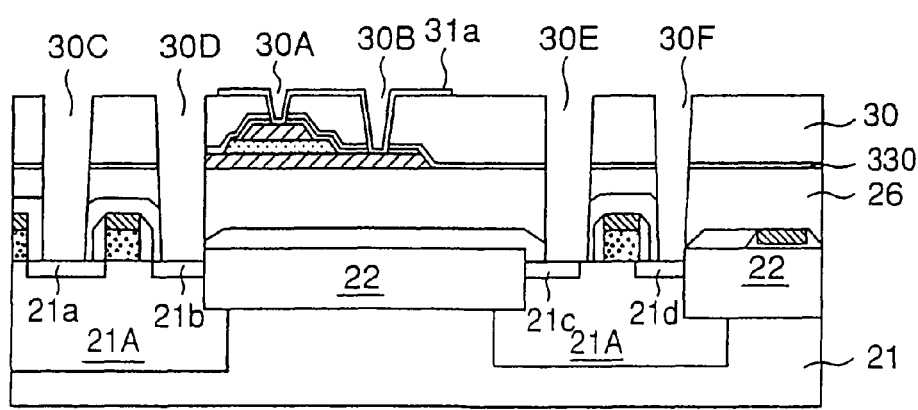

In the step shown in FIG. 5E, contact holes 30C through 30F exposing diffusion regions 21a through 21d, respectively, are formed through the interlayer insulation film 30. In the step shown in FIG. 5F, Ti/TiN film 31b consecutively layered with a Ti film with a thickness of 20 nm and a TiN film with a thickness of 50 nm is formed on the structure in FIG. 5E to a thickness of about 70 nm (=20+50 nm) by sputtering so as to cover the contact holes 30C through 30F as well as the TiN pattern 31a.

Figure 5F:
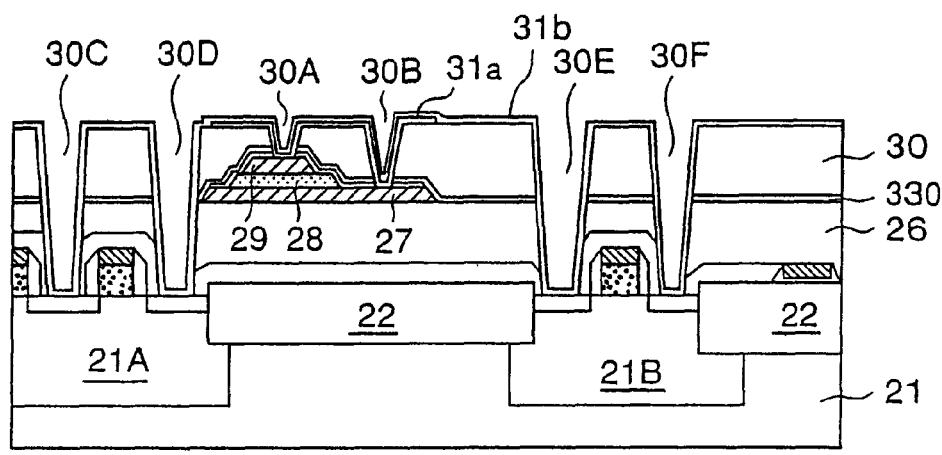
Figure 5G:
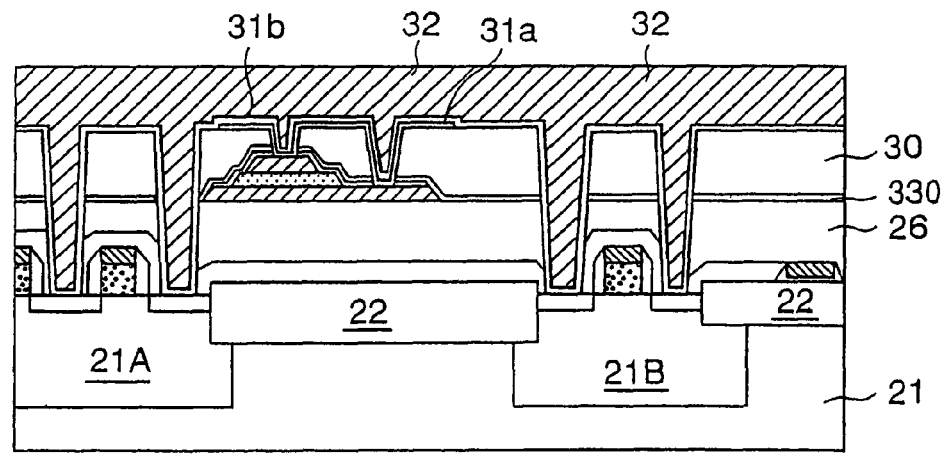

In the step shown in FIG. 5G, W layer 32 is formed on the Ti/TiN layer 31b by a CVD method to fill the contact holes 30A through 30F. In the step shown in FIG. 5H, W plugs 32A through 32F are formed in correspondence to contact holes 30A through 30F by removing W layer 32 on the interlayer insulation film 30 with a CMP method. Consequently, W plug 32A or 32B includes a consecutively layered layer system of TiN film, Ti film, TiN film and W film.

On the other hand, Ti/TiN patterns 31C' through 31F' are formed in contact holes 30C through 30F, respectively, so as to contact the inner wall plane and the bottom plane of each contact hole, and W plugs 32C through 32F contact the corresponding diffusion regions 21a through 21d through such TI/TiN patterns. In other words, in contact holes 30C through 30F, contact plugs have a layered structure of Ti/TiN film and W film.

Accordingly, by forming Ti patterns 31C' through 31F' in contact holes 30C through 30F, respectively, the adhesiveness of contact plugs 32C through 32F is enhanced, and as can be seen from table 1 the contact resistance will somewhat decrease.

In this embodiment as well, heat treatment in the oxidizing atmosphere is not conducted after the W layer 32 is formed, and the problem concerning increase in contact resistance due to oxidation of W plug will not arise.

Figure 5H:
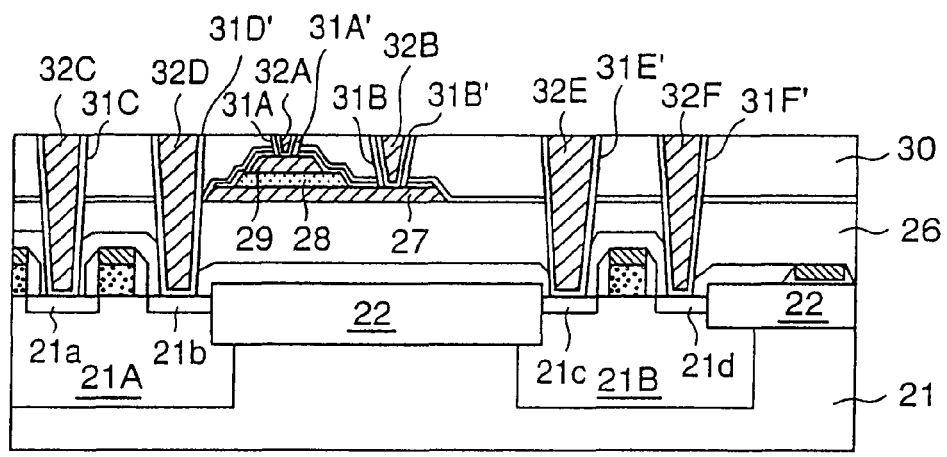
Figure 6A:
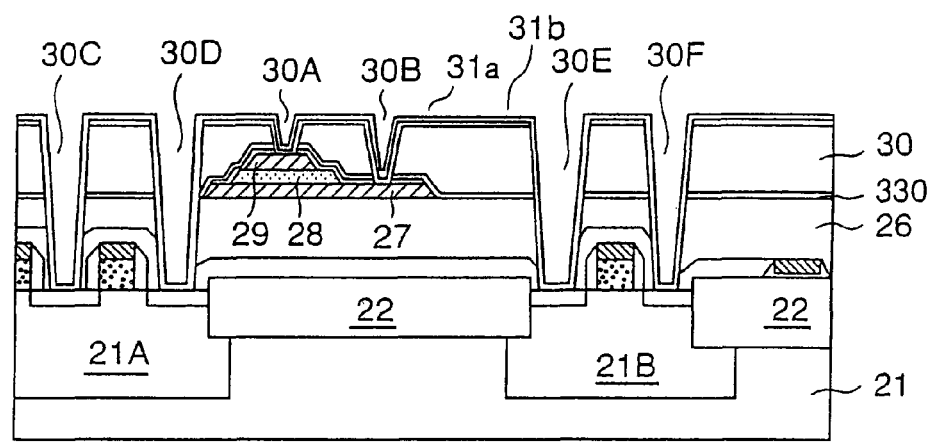
FIGS. 6A-6B are diagrams showing a variant of the fourth embodiment according to the present invention.
Figure 6B:
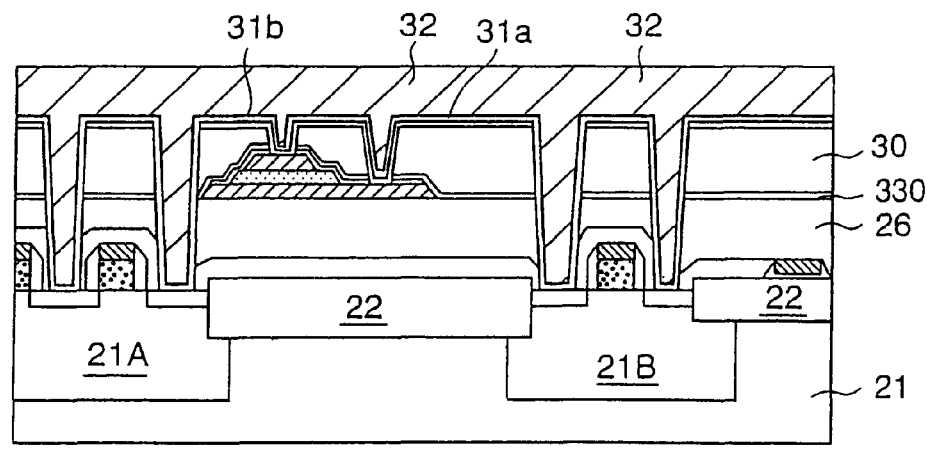

In the step shown in FIG. 5D, TiN film 31 is patterned to facilitate the plasma formation when performing plasma cleaning on contact holes 30C through 30F in the step shown in FIG. 5E. If, however, such plasma cleaning is not necessary, or if cleaning is carried out in another method, there is no need to pattern such TiN film 31. In this case, the structure shown in FIG. 6A and FIG. 6B corresponding to FIG. 5F and FIG. 5G is obtained. In this case as well, if W layer 32 is removed from the interlayer insulation film 30 by means of CMP method, the same structure as that shown in FIG. 5H is obtained.

While the preferred form of the present invention has been described, it is to be understood that the present invention is not limited to these embodiments, and variations and modifications may be made without departing from the scope of the present invention.

According to the present invention, in a semiconductor device having a fine ferroelectric capacitor, it is now possible to prevent hydrogen atmosphere used in a post treatment stage from entering the ferroelectric capacitor by covering the ferroelectric capacitor with a conductive nitride film formed so as to contact the upper electrode through the contact hole. It thus becomes possible to fill the fine contact holes with W film formed by a CVD method and to form the W plugs. Since deterioration in the ferroelectric capacitor will not occur even if W plugs are formed, there is no necessity to conduct heat treatment in the oxidizing atmosphere after forming the W plugs and the problem concerning increase in contact resistance due to oxidation of W plugs will not arise.

What is claimed is:

1. A method of manufacturing a semiconductor device comprising:
   (a) forming a transistor including a diffusion region formed in a semiconductor substrate;
   (b) forming a first insulation film over the transistor;
   (c) forming a ferroelectric capacitor including a lower electrode, a ferroelectric film, and an upper electrode over the first insulation film;
   (d) forming a second insulation film over the first insulation film so as to cover said ferroelectric capacitor;
   (e) forming a first contact hole and a second contact hole in said second insulation film so as to expose said upper electrode and said lower electrode respectively;
   (f) after forming a fist contact hole and a second contact hole, conducting heat treatment on said ferroelectric capacitor in an oxidizing atmosphere;
   (g) after conducting the heat treatment, forming a third contact hole in said second insulation film and in said first insulation film to expose said diffusion region;
   (h) forming a first conductive nitride film over said second insulation film so as to cover said first, second, and third contact holes;
   (i) forming a conductive layer over said first conductive nitride film so as to fill said first, second, and third contact holes.

2. A method of manufacturing a semiconductor device as claimed in claim 1, wherein said first conductive nitride film is formed so as to directly contact said exposed upper electrode in said first contact hole, to directly contact said exposed lower electrode in said second contact hole, and to directly contact said diffusion region in said third contact hole.

3. A method of manufacturing a semiconductor device as claimed in claim 2, wherein between said step (f) and said step (g), there are provided the steps of:
   (f1) depositing a second conductive nitride film on said second insulation film so as to include said first and second contact holes, and to directly contact said exposed upper electrode in said first contact hole and directly contact said exposed lower electrode in said second contact hole; and
   (f2) removing said second conductive nitride film except in regions of said first and second contact holes.

4. A method of manufacturing a semiconductor device as claimed in claim 2, wherein the method further comprises a step of consecutively depositing a metallic film and another conductive nitride film on said insulation film so as to include said first, second, and third contact holes.

5. A method of manufacturing a semiconductor device as claimed in claim 3, wherein the method further comprises a step of consecutively depositing a metallic film and another conductive nitride film on said second insulation film so as to include said first, second, and third contact holes.

6. A method of manufacturing a semiconductor device as claimed in claim 1, wherein the method further comprises the step of removing said conductive layer and said conductive nitride film from a surface of said second insulation film.

7. A method of manufacturing a semiconductor device as claimed in claim 5, wherein said step of removing said conductive layer and said conductive nitride film is performed by chemical mechanical polishing.

8. A method of manufacturing a semiconductor device as claimed in claim 5, wherein said step of removing said conductive layer and said conductive nitride film is performed by dry etching.

9. A method of manufacturing a semiconductor device as claimed in claim 7, wherein said step of removing said conductive nitride film is performed by dry etching using a conductive pattern formed on said conductive nitride film as a self-aligned mask.

10. A method of manufacturing a semiconductor device as claimed in claim 1, wherein said step of depositing conductive layer is performed by CVD method.

11. A method of manufacturing a semiconductor device as claimed in claim 1, wherein said step of depositing conductive nitride film is performed by sputtering.

12. A method of manufacturing a semiconductor device comprising a semiconductor substrate, a transistor formed on said semiconductor substrate and including a diffusion region formed in said semiconductor substrate; a ferroelectric capacitor formed on said semiconductor substrate and having a consecutively layered structure of a lower electrode, a ferroelectric film, and an upper electrode; the method comprising the steps of:
   (a) forming an insulation film on said semiconductor substrate so as to cover said ferroelectric capacitor;
   (b) forming a first contact hole and a second contact hole on said insulation film so as to expose said upper electrode and said lower electrode respectively;
   (c) conducting heat treatment on said ferroelectric capacitor in an oxidizing atmosphere;
   (d) forming a third contact hole in said insulation film to expose said diffusion region;
   (e) forming a first conductive nitride film on said insulation film so as to cover said first, second, and third contact holes;

(f) forming a conductive layer on said first conductive nitride film so as to fill said first, second, and third contact holes.

wherein said first conductive nitride film is formed so as to directly contact said exposed upper electrode in said first contact hole, to directly contact said exposed lower electrode in said second contact hole, and to directly contact said diffusion region in said third contact hole, wherein between said step (c) and said step (d), there are provided the steps of:

(c1) depositing a second conductive nitride film on said insulation film so as to include said first and second contact holes, and to directly contact said exposed upper electrode in said first contact hole and directly contact said exposed lower electrode in said second contact hole; and (c2) removing said second conductive nitride film except in regions of said first and second contact holes.

13. A method of manufacturing a semiconductor device as claimed in claim 12, wherein the method further comprises a step of consecutively depositing a metallic film and another conductive nitride film on said insulation film so as to include said first, second, and third contact holes.

14. A method of manufacturing a semiconductor device as claimed in claim 13, wherein said step of removing said conductive layer and said conductive nitride film is performed by chemical mechanical polishing.

15. A method of manufacturing a semiconductor device as claimed in claim 14, wherein said step of removing said conductive nitride film is performed by dry etching using a conductive pattern formed on said conductive nitride film as a self-aligned mask.

* * * * *